United States Patent
Vigdorchik et al.

(10) Patent No.: US 11,646,085 B2
(45) Date of Patent: May 9, 2023

(54) TOGGLE MODE FREQUENCY OPTIMIZATION BY DYNAMIC ODT MATCHING FOR NON-VOLATILE MEMORY

(71) Applicant: SANDISK TECHNOLOGIES LLC, Addison, TX (US)

(72) Inventors: Evgeny Vigdorchik, Haifa (IL); Nimrod Hermesh, Mazkeret Batia (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 140 days.

(21) Appl. No.: 17/349,965

(22) Filed: Jun. 17, 2021

(65) Prior Publication Data

US 2022/0406387 A1    Dec. 22, 2022

(51) Int. Cl.
*G11C 5/06*     (2006.01)
*G11C 16/32*    (2006.01)
*G11C 16/26*    (2006.01)
*G11C 16/04*    (2006.01)

(52) U.S. Cl.
CPC .......... *G11C 16/32* (2013.01); *G11C 16/0483* (2013.01); *G11C 16/26* (2013.01)

(58) Field of Classification Search
CPC ....... G11C 5/063; G11C 7/18; G11C 11/4097; G11C 5/025; G11C 5/04
USPC .............................................. 365/63, 189.15
See application file for complete search history.

(56) References Cited

U.S. PATENT DOCUMENTS

| | | | |
|---|---|---|---|
| 8,044,679 B2 | 10/2011 | Kim | |
| 8,531,898 B2 | 9/2013 | Seol et al. | |
| 9,780,782 B2 | 10/2017 | Bains et al. | |
| 10,205,431 B2 * | 2/2019 | Kang | G11C 29/028 |
| 10,344,020 B2 | 7/2019 | Kim et al. | |
| 10,630,289 B1 | 4/2020 | Huang et al. | |
| 2020/0402593 A1 * | 12/2020 | Hassan | G11C 16/32 |
| 2021/0006247 A1 | 1/2021 | Lee et al. | |

* cited by examiner

*Primary Examiner* — Son T Dinh
(74) *Attorney, Agent, or Firm* — Morgan, Lewis & Bockius, LLP

(57) ABSTRACT

A data storage system includes a plurality of memory dies and interface circuitry, including a receiver configured to receive pulses of a read clock signal; an I/O contact pad coupled to the receiver via a signal path of an interface channel; and on-die-termination (ODT) circuitry coupled to the I/O contact pad and the receiver. The ODT circuitry includes a plurality of resistor pairs, each including a pull-up resistor selectively coupled to the signal path via a first switch, and a pull-down resistor selectively coupled to the signal path via a second switch; and ODT control circuitry configured to enable ODT at the interface circuitry by causing each of the switches to be closed during a first stage of the read operation, and disable ODT at the interface circuitry by causing each of the switches to be open during a final stage of the read operation.

20 Claims, 10 Drawing Sheets

TOGGLE MODE FREQUENCY OPTIMIZATION BY DYNAMIC ODT MATCHING FOR NON-VOLATILE MEMORY

TECHNICAL FIELD

The present description relates to dynamic adjustments to on-die-termination (ODT) at interface circuitry of a storage medium in a non-volatile memory system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

One way to increase the capacity and operating speed of non-volatile memories is to stack multiple memory dies into a single package, and increase transfer frequencies at the interface between the package and a storage controller. However, as the number of storage dies increases, and as transfer speeds increase, there may be a growing impedance mismatch at the interface that causes energy reflections and ultimately degrades signal integrity and performance.

SUMMARY

To address the impedance mismatch at the interface between the storage medium package and the storage controller, a dynamic on-die-termination (ODT) scheme may be implemented, including a plurality of ODT stages, each having a different resistance. The dynamic ODT scheme may initially implement a low ODT resistance, and phase out the ODT over time, eventually disabling ODT when the effects of impedance mismatches are no longer present. Dynamically adjusting the level of ODT at the input pads of the storage medium allows energy reflections to be absorbed without negatively affecting power consumption or performance.

In one aspect, a data storage system includes a package including a plurality of memory dies and interface circuitry.

The interface circuitry includes: a receiver coupled to the plurality of memory dies and configured to receive pulses of a read clock signal associated with a read operation; an input/output (I/O) contact pad coupled to the receiver via a signal path and configured for coupling to a corresponding pad of a storage controller via an interface channel; and on-die-termination (ODT) circuitry coupled to the I/O contact pad and the receiver.

The ODT circuitry includes: a plurality of resistor pairs, wherein each resistor pair of the plurality of resistor pairs includes (i) a pull-up resistor selectively coupled to the signal path via a first switch, and (ii) a pull-down resistor selectively coupled to the signal path via a second switch; and ODT control circuitry configured to (i) enable ODT at the interface circuitry by causing each of the first and second switches of each resistor pair to be closed during a first stage of the read operation, and (ii) disable ODT at the interface circuitry by causing each of the first and second switches of each resistor pair to be open during a final stage of the read operation.

In some implementations, the first stage is defined by a first predetermined number of pulses of the read clock signal associated with the read operation; and the final stage is defined by a final predetermined number of pulses of the read clock signal associated with the read operation.

In some implementations, the ODT control circuitry is further configured to successively decrease ODT at the interface circuitry by: causing first and second switches associated with a first resistor pair of the plurality of resistor pairs to be open during a second stage of the read operation, the second stage following the first stage and defined by a second predetermined number of pulses; causing first and second switches associated with the first resistor pair and a second resistor pair of the plurality of resistor pairs to be open during a third stage of the read operation, the third stage following the second stage and defined by a third predetermined number of pulses; and causing first and second switches associated with the first resistor pair, the second resistor pair, and a third resistor pair of the plurality of resistor pairs to be open during a fourth stage of the read operation, the fourth stage following the third stage and defined by a fourth predetermined number of pulses.

In some implementations, a minimum pulse width of the read clock signal remains, during the first stage and the final stage, above a predetermined threshold associated with the receiver.

In some implementations, the plurality of resistor pairs includes six resistor pairs; and the final stage is at least a seventh stage of the read operation.

In some implementations, the first stage is associated with at least two pulses and no greater than eight pulses; and the final stage is associated with at least sixteen pulses.

In some implementations, each resistor of each resistor pair has an equivalent resistance value.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
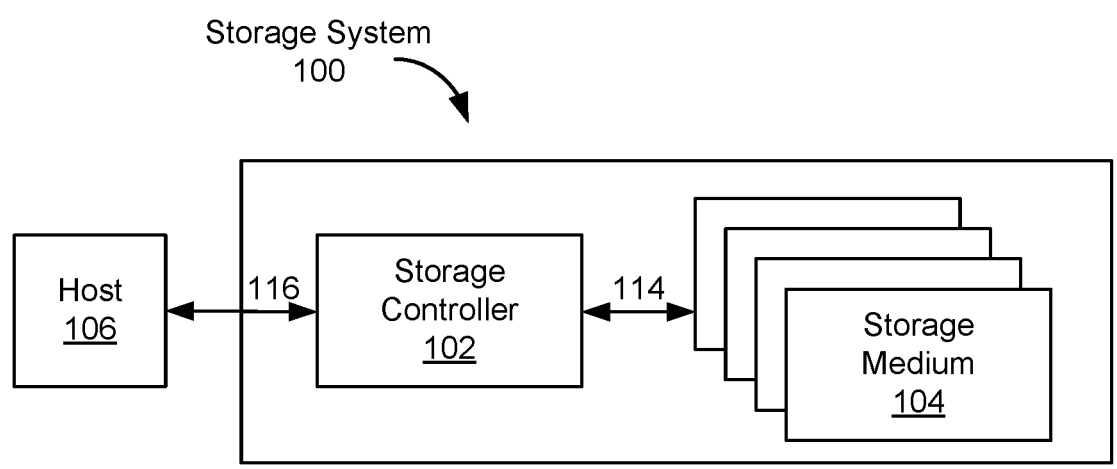
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate.

The storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104.

Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
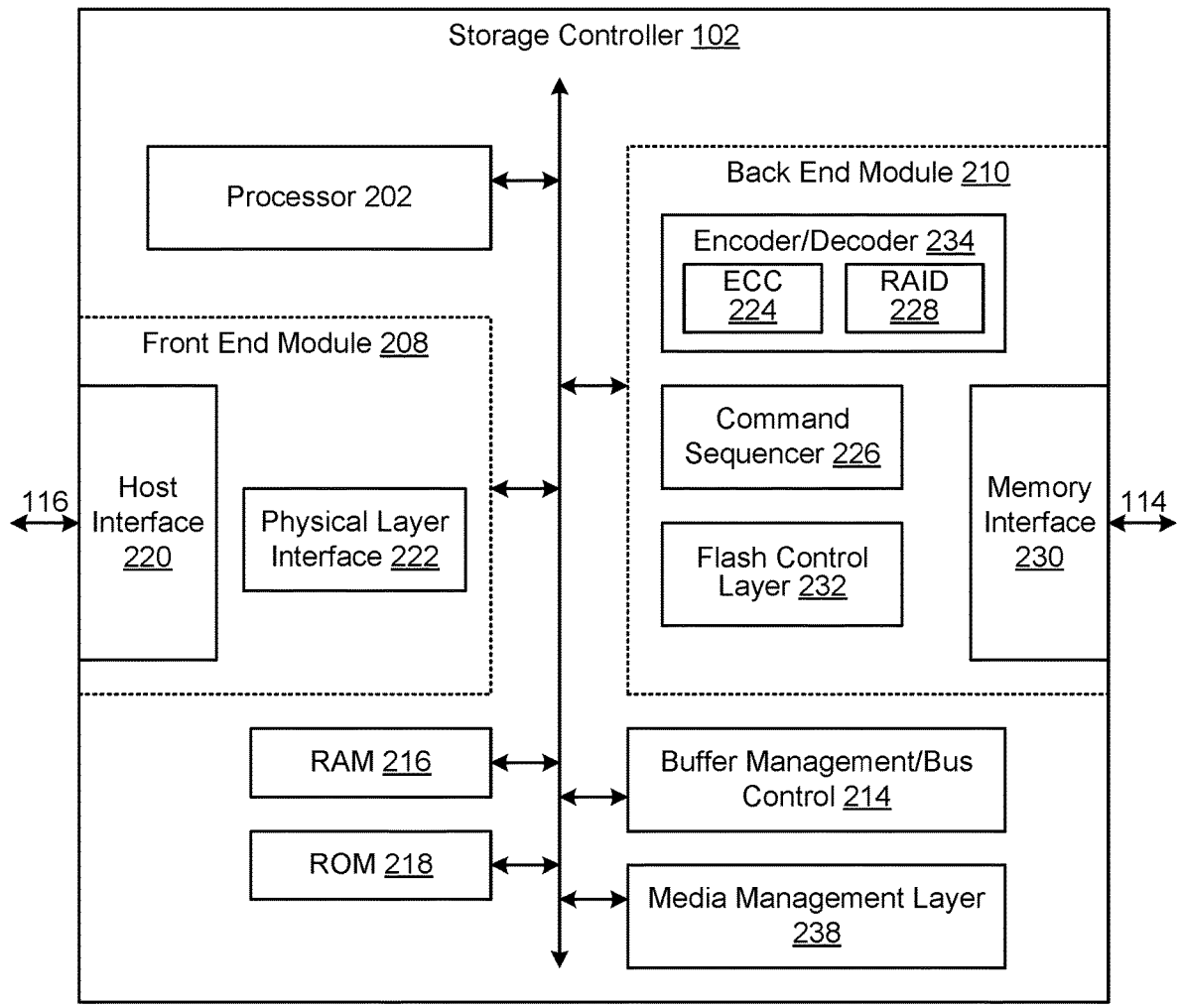
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system.

For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code.

Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310, (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals.

The host interface 220 may include electrical interface circuitry that provides a physical connection to the channel (s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104.

In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104.

The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
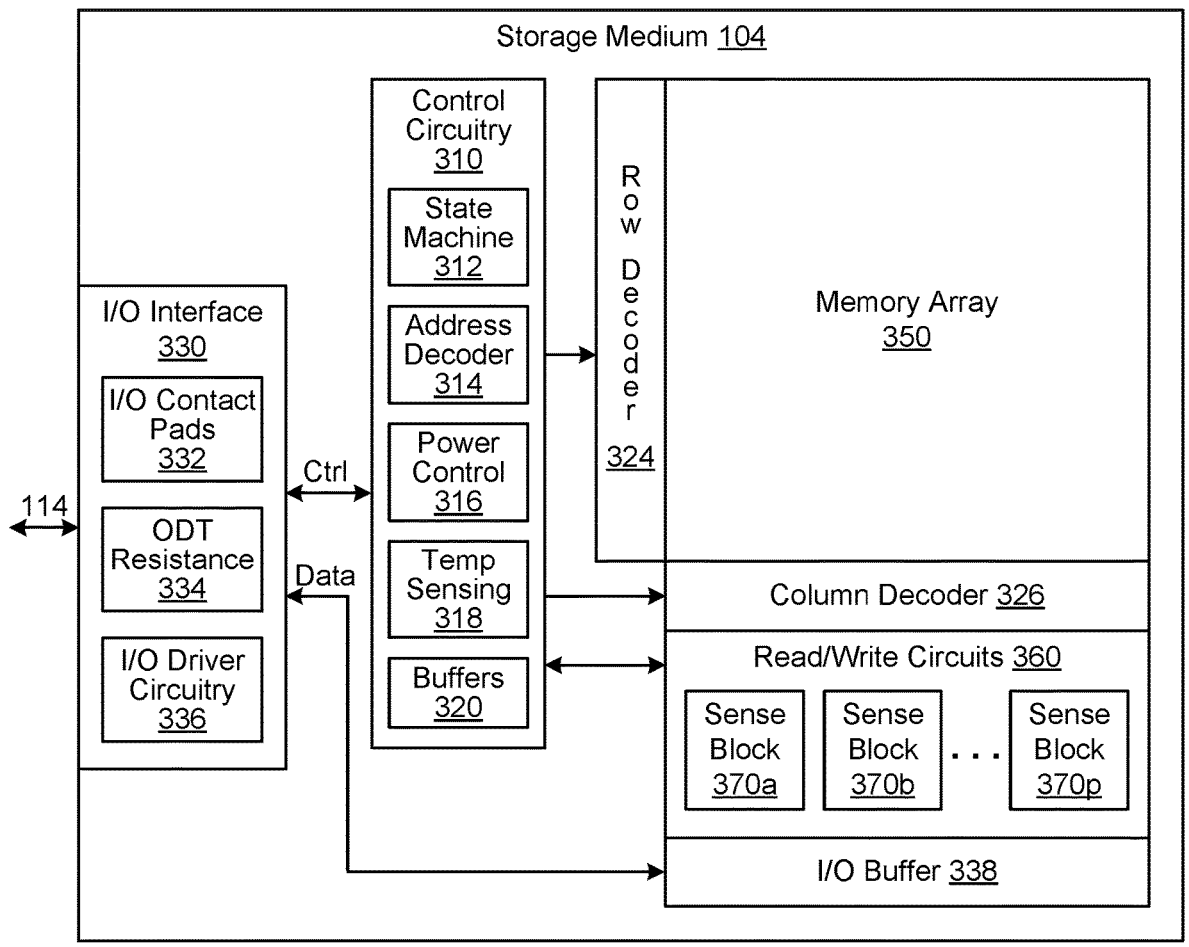
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. The I/O interface 330 may be connected to the control circuitry 310, row decoder 324, column decoder 326, read/write circuits 360, and/or memory array 350.

The I/O interface 330 is configured to interface and communicate with the memory interface 230 of the storage controller 102. The I/O interface 330 may include input/output (I/O) driver circuitry 336 that is configured to generate and receive signals carrying data, commands, or other information to be transmitted to and received from the storage controller 102. For example, data sensed into the I/O buffer 338 (as part of a read operation) may be sent to the I/O driver circuitry 336 for transmission to the storage controller 102.

Similarly, data received from the storage controller 102 (as part of a write operation) may be received by the I/O driver circuitry 336, and the I/O driver circuitry 336 may communicate the data to the I/O buffer 338. Additionally, commands to be communicated between the storage controller 102 and the state machine 312 may be communicated via the I/O driver circuitry 336.

Additionally, the I/O interface 330 may include input/output (I/O) contact pads 332 (also referred to as pins) that connect to respective communication lines of the interface channel 114. The I/O contact pads 332 are coupled to the I/O driver circuitry 336 and are configured to send signals to and receive signals from the I/O driver circuitry 336. For example, the signals that the I/O driver circuitry 336 generates for transmission to the storage controller 102 may be communicated from the I/O driver circuitry 336 to the I/O contact pads 332.

Similarly, the signals that the I/O interface 330 receives from the storage controller 102 may be sent from the I/O contact pads 332 to the I/O driver circuitry 336. The I/O contact pads 332 may be connected to packaging components, such as wire bonds, of a packaging of storage mediums (memory dies) 104, and may send signals to and receive signals from the packaging components in order for the signals to be communicated between the storage controller 102 and the I/O interface 330 via interface channel 114.

Additionally, the I/O interface 330 may include on-die termination (ODT) resistance circuitry 334, which may include one or more resistors or other circuit components providing a resistance for impedance matching. The ODT resistance circuitry 334 may provide termination impedance for signal paths that communicate signals between the storage controller 102 and the storage medium(s) 104, and in particular, may be used for impedance matching between the storage medium(s) 104 and the characteristic impedances of the signal paths.

Resistors of the ODT resistance circuitry 334 may be connected to the I/O contact pads 332. In addition, the ODT resistance circuitry 334 may provide variable resistance levels or values. The resistance levels or values that the ODT resistances provide may be controlled by the storage controller 102, the state machine 312, or a combination thereof.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Table 1 provides a definition of one example of a Toggle Mode Interface. For each of the signals listed in the table below, I/O Interface has a corresponding I/O pad.

TABLE 1

| Signal | Type | Function |
|---|---|---|
| ALE | Input | Address Latch Enable controls the activating path for addresses to the internal address registers. Addresses are latched on the rising edge of WEn with ALE high. |
| CE | Enable | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable controls serial data out, and when active, drives the data onto the I/O bus. |
| BRE | Input | Read Enable Complement. |
| WE | Input | Write Enable controls writes to the I/O port. Commands and addresses are latched on the rising edge of the WEn pulse. |
| WP | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| BDQS | Input/Output | Data Strobe complement (used for DDR) |
| DQ[7:0] | Input/Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals. |
| VPP | Supply | Optional, high voltage, external power supply. |
| VREF | Supply | Reference voltage (e.g., for Toggle Mode DDR2). |
| VSS | Supply | Ground. |

During a read operation, the flash control layer 232 activates RE/BRE signals and sends them to the RE/BRE I/O contact pads 332 of the storage medium 104. RE/BRE signals then travel through the storage medium 104 internal logic path (e.g., state machine 312) and enable DQS/BDQS and data (DQ[7:0]) transfer to the flash control layer 232.

Data received at the I/O interface 330 for writing to the memory array 350 (in accordance with a write command) is latched in an I/O buffer 338 (also referred to as a page buffer or data cache) before being written (programmed) to the memory array 350. Similarly, data that is read (sensed) from the memory array 350 (in accordance with a read command) is latched in the I/O buffer 338 before being transmitted to the storage controller 102 via the I/O interface 330.

The I/O buffer 338 may be included in the I/O interface 330 or otherwise communicatively coupled to the I/O interface 330. The I/O buffer 338 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350.

The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1or 0) stored in respective memory cells.

The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 338, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data.

The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 338.

Input and output of data to and from the sense amplifiers are performed via the data latches of the I/O buffer 338. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 338 may function as the cache memory of the storage medium 104.

The control circuitry 310, cooperates with the read/write circuits 360 to perform memory operations (e.g., write, read, erase, and others) on the memory array 350. In some implementations, control circuitry 310, includes a state machine 312, an on-chip address decoder 314, a power control circuit 316, a temperature sensing circuit 318 and/or buffers 320.

The state machine 312 provides die-level control of memory operations and/or provides status information to the storage controller 102. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature sensing circuit 318 may be configured to detect temperature in or around the storage medium 104. The temperature sensing circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature sensing circuit 318 power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row address decoder 324 and by bit lines via a column address decoder 326. The row address decoder 324 may decode a row address and select a particular word line in the memory array 350 when writing or reading data to/from the memory cells in the memory array 350. The column address decoder 324 may decode a column address to select a particular group of bit lines in the memory array 350 to be electrically coupled to the I/O buffer 338.

The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates.

The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein.

Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
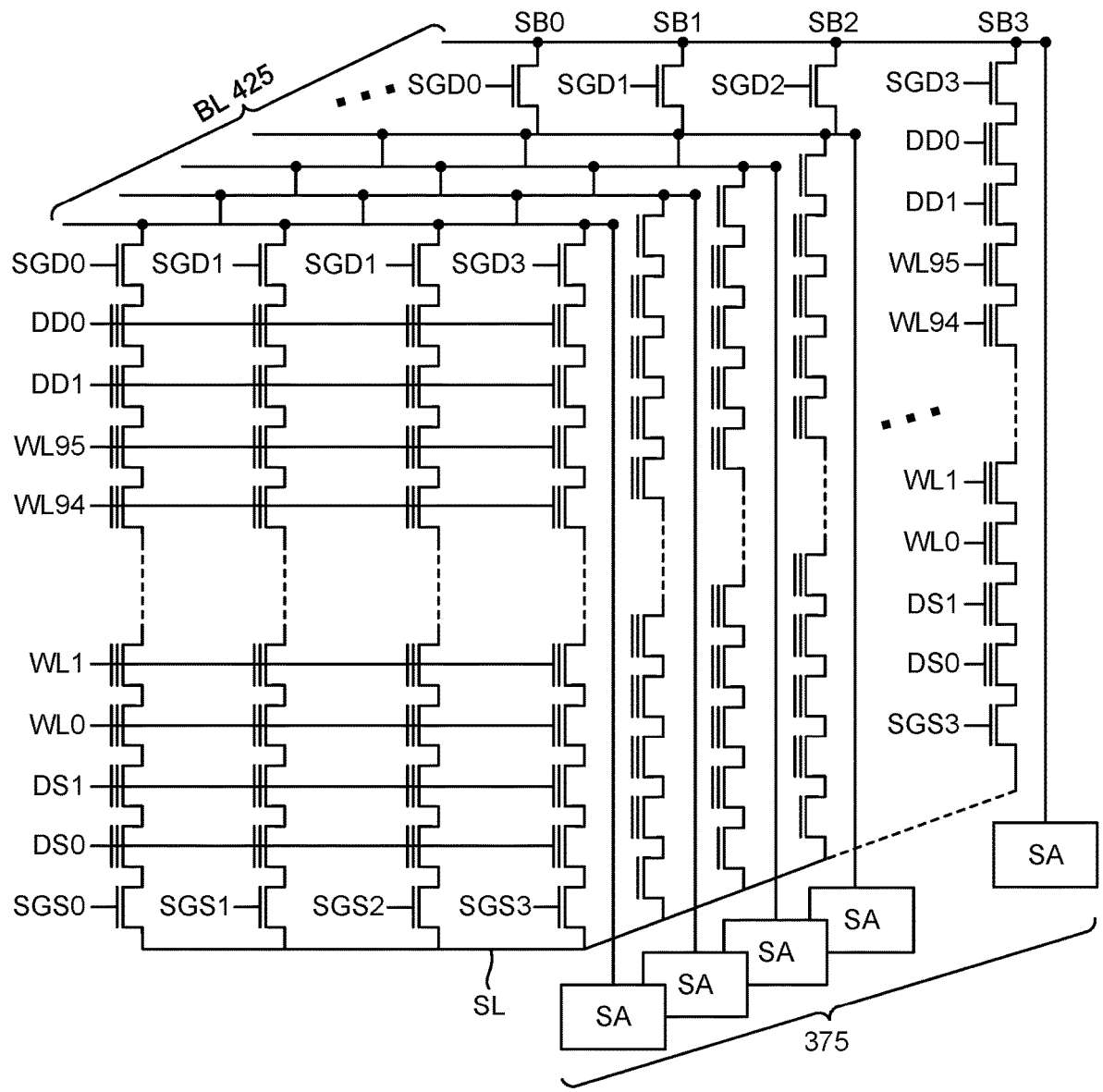
FIG. 4 is a schematic diagram of a portion of the memory array 350 depicted in FIG. 3 in accordance with some implementations.

FIG. 4 is a schematic diagram of a portion of the memory array 350 depicted in FIG. 3 in accordance with some implementations. FIG. 4 shows physical word lines WLL0-WLL95 running across an entire block, and bit lines 425. Within the block, each bit line is connected to four NAND strings.

Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line SL.

The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers SA 375 in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5A:
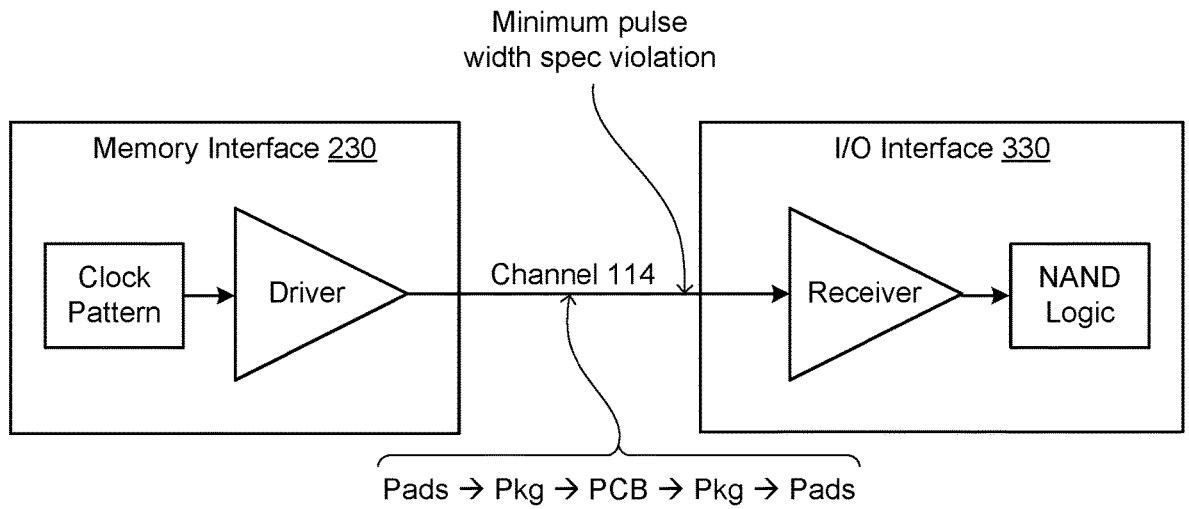
FIG. 5A depicts a block diagram of interface circuitry in accordance with some implementations.

FIG. 5A depicts a block diagram of interface circuitry in accordance with some implementations. The interface circuitry depicted in FIG. 5A includes components of a memory interface 230 (described above with reference to FIG. 2) and I/O interface 330 (described above with reference to FIG. 3). An interface channel 114 is coupled to each interface as described above.

During a programming operation, the storage controller 102 uses driver circuitry in the memory interface 230 to transmit data, commands, and clock signals to receiver circuitry in the I/O interface 330 via channel 114. Conversely, during a read operation, the storage medium 104 uses driver circuitry in the I/O interface 330 to transmit data and clock signals to receiver circuitry in the memory interface 230 via channel 114. FIG. 5A only depicts the driver circuitry in the memory interface 230 and the receiver circuitry in the I/O interface 330 for the sake of brevity, and so as not to obscure more pertinent aspects of the example implementations disclosed herein.

The memory interface 230 of the storage controller 102 includes driver circuitry (sometimes referred to as an ASIC I/O), and a clock pattern generator configured to generate clock signals (e.g., included in Table 1 above) for transmission of data and commands via the driver circuitry across channel 114 to the I/O interface 330.

The I/O interface 330 of the storage medium 104 includes receiver circuitry (sometimes referred to as a NAND I/O), and additional logic (e.g., NAND logic) configured to convey received data and commands to other components of the storage medium 104, such as control circuitry 310, and/or I/O buffer 338 (see FIG. 3).

The interface channel 114 includes a plurality of physical components configured to vary signals between the memory interface 230 of the storage controller 102 and the I/O interface 330 of the storage medium 104. A portion of the interface channel 114 includes one or more physical signal paths, referred to as traces, integrated into a printed circuit board (PCB) upon which the storage controller 102 and the storage medium 104 are installed. The PCB traces extend between packaging of the storage controller 102 and packaging of the storage medium 104. The PCB traces may be implemented as microstrips, striplines, vias, a combination thereof, or any other type of conductive material (e.g., copper) configured to carry a signal over the PCB between the storage controller 102 and the storage medium 104.

The PCB traces are connected to conductive portions of the packaging of the storage controller 102 and the storage medium 104. The packaging of the storage controller 102 and the storage medium 104 may include solder balls (e.g., those of a ball grid array structure), vias, and/or traces integrated in one or more die substrates, contact pads 332, and/or wire bonds (e.g., connecting the packaging and the I/O contact pads 332).

Thus, in some implementations, a signal path for data and commands traveling between the storage controller 102 and the storage medium 104 includes the driver of the memory interface 230, coupled to I/O contact pads of the memory interface 230, coupled to packaging elements (e.g., solder balls) of the storage controller 102, couple to PCB traces, coupled to packaging elements (e.g., solder balls) of the storage medium 104, coupled to contact pads 332 of the I/O interface 330, coupled to the receiver of the I/O interface 330.

In some implementations, a storage system 100 (FIG. 1) may include a plurality of storage mediums 104, each implemented as a stacked die. Signal integrity of multiple die storage devices (e.g., with more than eight stacked dies) becomes very challenging with rising transfer speed data rates (the speed at which data is transferred to between the storage controller 102 and the storage mediums 104) due to differences in impedance between the storage mediums 104 and components of the channel 114.

Specifically, as transfer speeds increase, and as the number of storage dies increases, the input impedance of the storage mediums 104 decreases compared to the impedance of the channel 114, giving rise to an impedance mismatch.

This is because the input impedance of storage die packaging decreases with increasing quantities of NAND dies in the stack, while the PCB impedance remains the same. Such an impedance mismatch may cause energy reflections and ultimately a degradation in signal integrity and performance.

The energy reflections caused by impedance mismatches manifest in signal pulses having pulse widths that are below the minimum thresholds required by the receiver in the I/O interface 330. Stated another way, the minimum pulse width of a signal at the contact pads 332 of the I/O interface 330 must be above a minimum allowed value that is defined by the specification of the receiver of the I/O interface 330. Each receiver defines a minimum pulse width that the receiver can properly latch. In order for the storage medium 104 to not miss any cycles, clock signals need to meet the specified minimum pulse width.

Figure 5B:
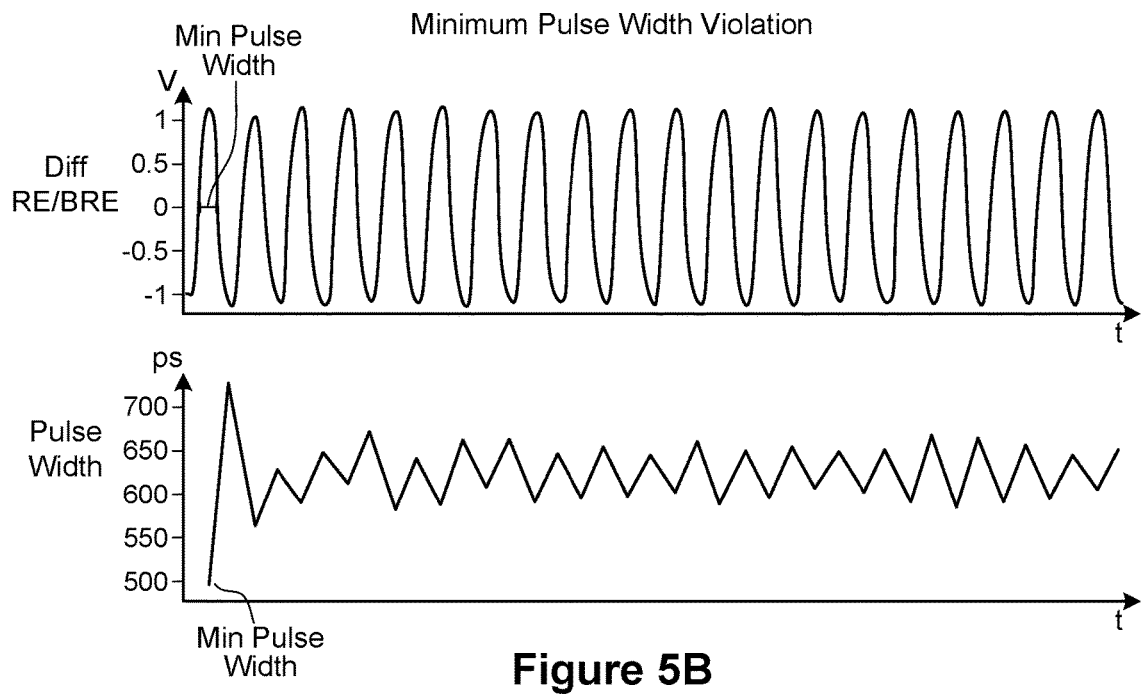
FIG. 5B is a graph showing clock pulses and their associated pulse widths over time in accordance with some implementations.

FIG. 5B is a graph showing clock pulses and their associated pulse widths over time in accordance with some implementations. The clock pulses are associated with a pair of differential clock signals (e.g., read enable RE and read enable complement BRE) sent from the storage controller 102 to the storage medium 104 during a read cycle, and measured at the contact pads of the I/O interface 330. The read enable signals RE and BRE are signals used when data is serially output from the I/O interface 330 during a read operation initiated by the storage controller 102.

For read operations, the channel response on the first clock cycles (first pulse) suffers from reflections (sometimes referred to as first pulse reflection) due to the impedance mismatch described above. This causes the first RE/BRE pulse to have the smallest pulse width. In the example depicted in FIG. 5B, the first pulse has a width of 511 picoseconds (ps). Stated another way, the minimum pulse width of the differential RE/BRE clock signals for a given read operation is 511 ps at its first clock cycle.

Since first pulse reflection negatively affects the signal and frequently violates NAND I/O receiver minimum allowed pulse width, the rest of this disclosure describes different solutions for eliminating first pulse reflection.

Some ways to compensate for the impedance mismatch that causes first pulse reflections include lowering the PCB impedance by widening the PCB traces, thinning the PCB core, or using a lower-impedance PCB core dielectric material. However, wide PCB traces cause more crosstalk, a thin PCB core negatively impacts mechanical strength of the PCB, and special core dielectric materials increase the PCB cost. Further, such modifications may create an asymmetric channel 114, having a negative impact on read cycle performance. Thus, the aforementioned solutions have unique disadvantages in terms of signal integrity, robustness, cost, and performance.

Figure 6A:
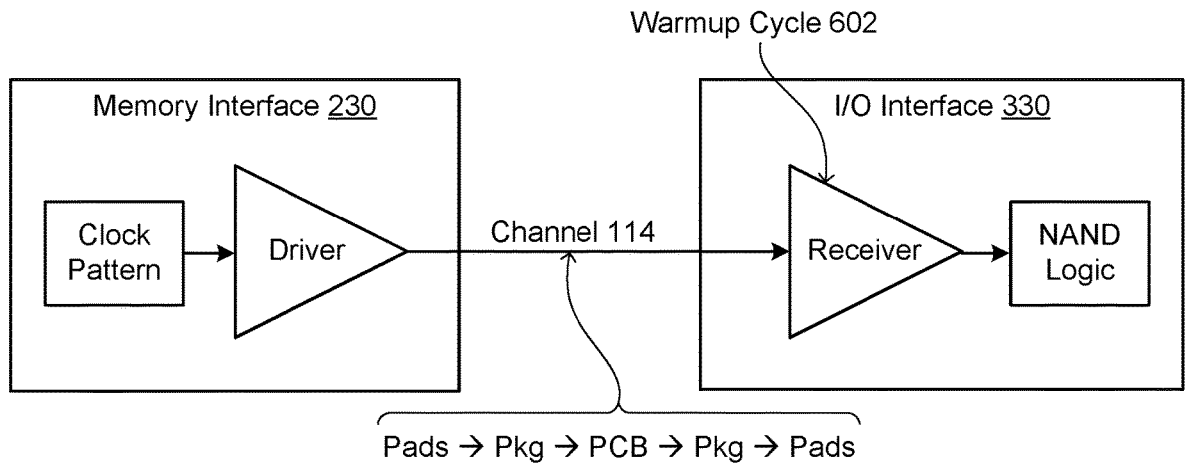
FIGS. 6A-6B depict a warmup delay scheme to compensate for the impedance mismatch that causes first pulse reflections in accordance with some implementations.
Figure 6B:
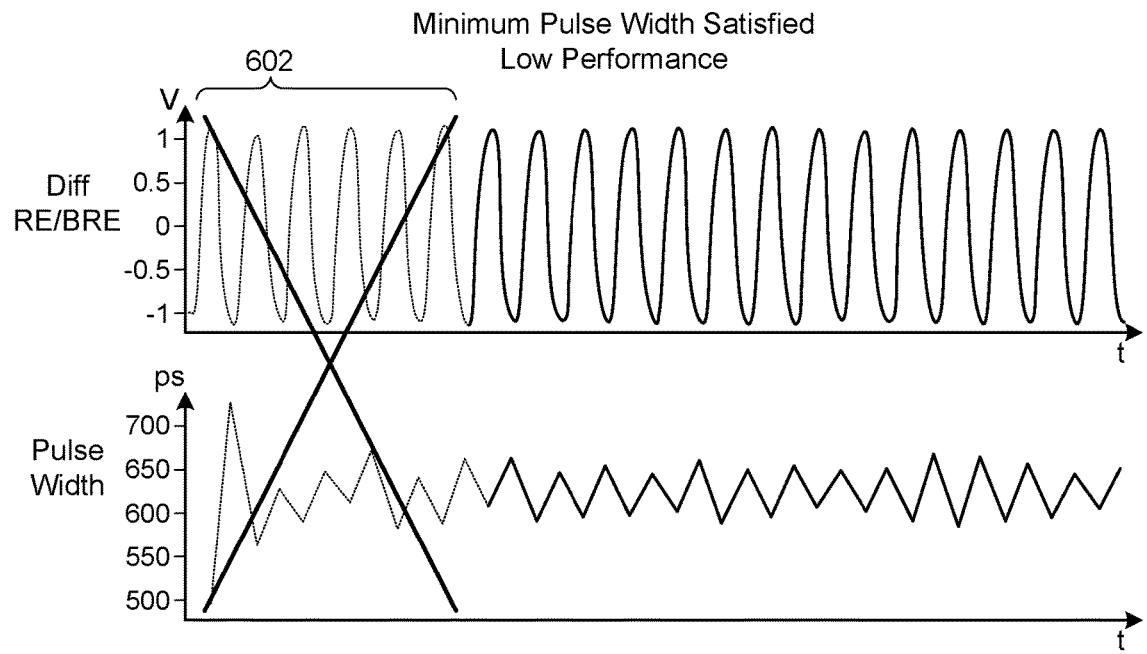

FIGS. 6A-6B depict a warmup delay scheme to compensate for the impedance mismatch that causes first pulse reflections in accordance with some implementations. FIGS. 6A-6B correspond to FIGS. 5A-5B, with the addition of a warmup cycle 602 implemented at the I/O interface 330, during which one or more initial clock cycles are toggled without data transfer. Stated another way, data transfer is delayed for one or more of the RE/BRE cycles. At the end of the warmup cycle, when data transfer commences, the minimum pulse width of all of the remaining RE/BRE pulses satisfies the minimum pulse width specification associated with the I/O interface receiver.

While the warmup delay solves first pulse reflection issues by delaying data transfer until such issues would have no effect on the data operation, such delays have a direct impact on performance. This is because no data is being transferred during the warmup cycle, which decreases the number of bits per second that may be transferred during a given read operation.

Figure 7A:
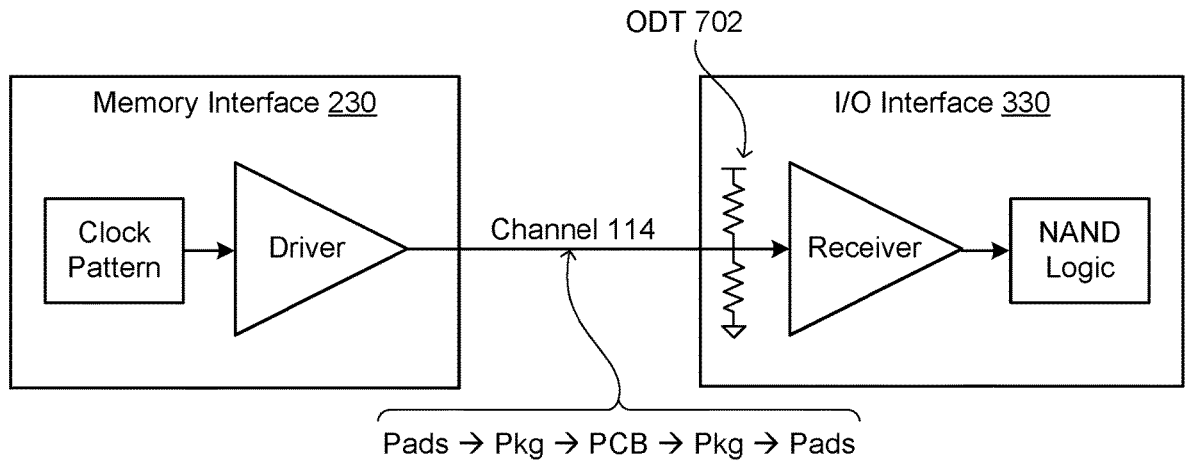
FIGS. 7A-7B depict a static impedance matching scheme to compensate for the impedance mismatch that causes first pulse reflections in accordance with some implementations.
Figure 7B:
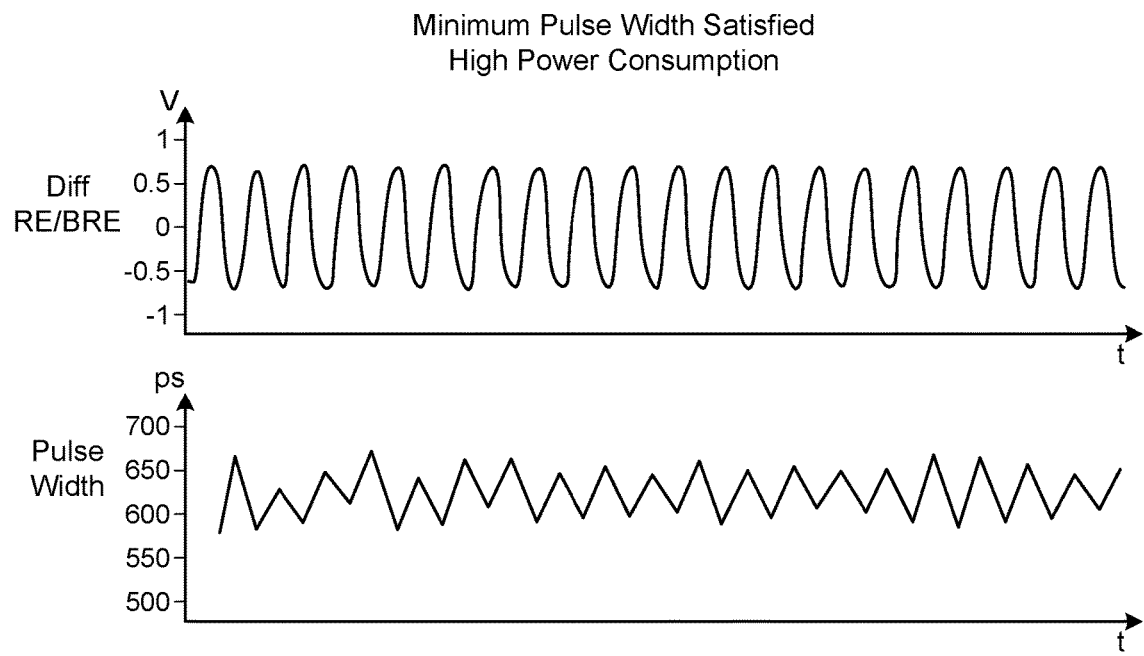

FIGS. 7A-7B depict a static impedance matching scheme to compensate for the impedance mismatch that causes first pulse reflections in accordance with some implementations. FIGS. 7A-7B correspond to FIGS. 5A-5B, with the addition of on-die-termination (ODT) circuitry 702 added to the RE and BRE signal paths at the I/O interface 330.

The ODT circuitry 702 comprises a pull-up resistor and a pull-down resistor coupled to the signal path for RE at the I/O contact pad for the RE signal, and a pull-up resistor and a pull-down resistor coupled to the signal path for BRE at the I/O contact pad for the BRE signal. The ODT circuitry 702 terminates all the reflections into heat, thereby solving the first pulse reflection issues described above. However, the resistors of the ODT circuitry 702 provide a current path from VDD to ground. Thus, the ODT circuitry 702 consumes direct current (DC) power and requires package heat silk considerations even after the transient state ends (after the state during which there are signal reflections ends). The high power consumption caused by the ODT circuitry 702 may constitute a critical power drain in battery-powered applications such as mobile devices. When the transient state ends, ODT termination is no longer required. However, the ODT circuitry 702 remains coupled to the signal paths, causing the increased power consumption to continue due to the static nature of the ODT resistance.

Figure 8A:
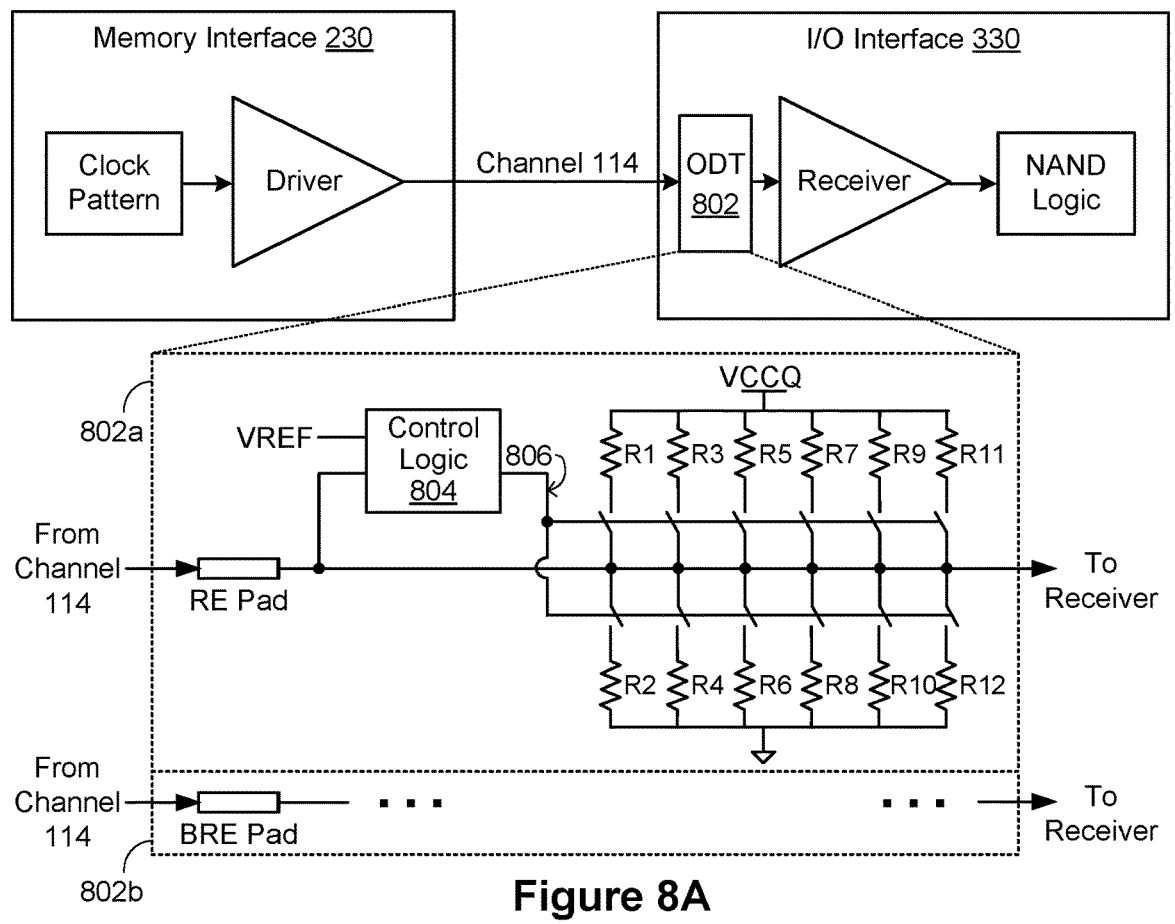
FIGS. 8A-8B depict a dynamic impedance matching scheme to compensate for the impedance mismatch that causes first pulse reflections in accordance with some implementations.
Figure 8B:
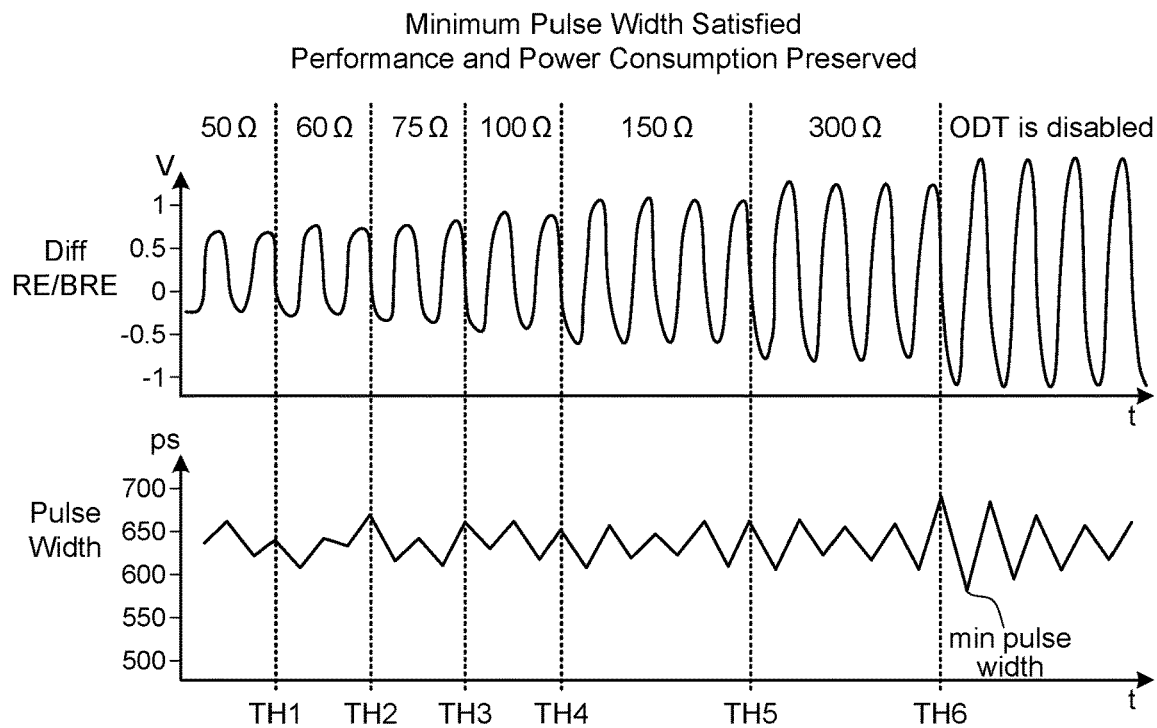

FIGS. 8A-8B depict a dynamic impedance matching scheme to compensate for the impedance mismatch that causes first pulse reflections in accordance with some implementations. FIGS. 8A-8B correspond to FIGS. 5A-5B, with the addition of on-die-termination (ODT) circuitry 802 added to each of the RE signal path (circuitry 802a) and the BRE signal path (circuitry 802b) at the I/O interface 330. ODT circuitry 802a and 802b are identical; however, only once instance of this circuitry (802a) is depicted in the figure so as not to obscure more pertinent aspects of the inventive concepts disclosed herein.

The ODT circuitry 802 comprises a plurality of pull-up resistors (R1, R3, R5, R7, R8, R11) and a plurality of pull-down resistors (R2, R4, R6, R8, R10, R12) arranged in pairs (e.g., a first pair R1/R2, a second pair R3/R4, and so forth). Each pair of resistors is coupled to the signal path by a pair of switches, one for a respective pull-up resistor and one for a respective pull-down resistor. Each pair of switches is operated by control logic 804 (described in more detail below with reference to FIGS. 9-10).

The control logic 804 controls the plurality of resistor pairs so that a first plurality of RE/BRE pulses associated with a read operation are initially subjected to a relatively high level of ODT (referred to as a first stage), while successively received pulses are subjected to successively decreasing levels of ODT (referred to as a second stage, a third stage, and so forth) until the ODT circuitry is completely disabled (referred to as a final stage).

The relatively high level of ODT during the first stage is achieved by all of the switches being closed (thereby providing a low resistance between VCCQ and ground), the successively decreasing levels of ODT during successive stages are achieved by successively opening the switches (thereby increasing the resistance between VCCQ and ground), and the ODT circuitry is completely disabled during the final stage when all of the switches are open (thereby cutting off the current path between VCCQ and ground).

The initial high level of ODT absorbs the reflections of the first pulses received at the I/O contact pad while the interface circuitry (114, 330) is in a transient state (a state in which the signal path is susceptible to reflections due to impedance mismatch). All of the terminations are disabled in the final stage when the interface circuitry is in a steady state (a state in which the signal path is not susceptible to reflections that could cause minimum pulse width violations).

The control logic circuitry 804 counts the coming clock pulses and successively turns off ODT resistor pairs (also referred to as ODT stages) at suitable timing. Each resistor may have a value of NΩ. As such, the value pull-up resistor or pull-down resistance would be equal to N/KΩ, where K is equal to the number of resistors that are coupled to the signal path via closed switches. For example, if each resistor has a value of 300Ω, then the following ODT resistance values may be achieved:

1st ODT stage, 6 resistor pairs coupled to signal path: 300/6=50Ω

2nd ODT stage, 5 resistor pairs coupled to signal path: 300/5=60Ω

3rd ODT stage, 4 resistor pairs coupled to signal path: 300/4=75Ω

4th ODT stage, 3 resistor pairs coupled to signal path: 300/3=100Ω

5th ODT stage, 2 resistor pairs coupled to signal path: 300/2=150Ω

6th ODT stage, 1 resistor pair coupled to signal path: 300/1=300Ω.

After the 6th ODT stage, 0 resistor pairs coupled to signal path: ODT is disabled The aforementioned values are provided for illustration only, and are not meant to be limiting. For example, additional or fewer resistor pairs may be included in ODT circuitry 802, and the resistance values may be higher or lower than 300Ω.

At the beginning of a read operation, the ODT circuitry 802 is in its first stage (all of the switches are closed) in order to start with the strongest ODT (e.g., 50Ω). Every X clock cycles (where X is at least 1, and can change between stages), one pair of pull-up and pull-down resistors is disconnected exactly when the clock reaches a reference voltage VREF, thereby increasing the equivalent ODT value until the ODT circuitry reaches full discontinuity. After the final ODT stage, the interface toggles to an ODT-disabled receiver and does not consume DC power (since there is no longer a current path between VCCQ and ground).

FIG. 8B shows first pulse width improvement achieved by 6 ODT stages. The minimum pulse width value decreases when ODT switches to being disabled after the final ODT stage, but this minimum pulse width is still improved when compared to that described above with reference to FIG. 5B. For example, using the same simulation setup as depicted in FIG. 5B, the minimum pulse width in FIG. 8B is 577 ps, which is 66 ps higher than the 511 ps in FIG. 5B (with no dynamic impedance matching).

The minimum pulse width may be improved even more by higher scaling of ODT (e.g., more stages and/or different resistance values) and increasing the number of toggling pulses during each stage. An improvement of 66 ps would be significant with respect to a high-speed data rate (e.g., according to the TM1600 specification).

Figure 9:
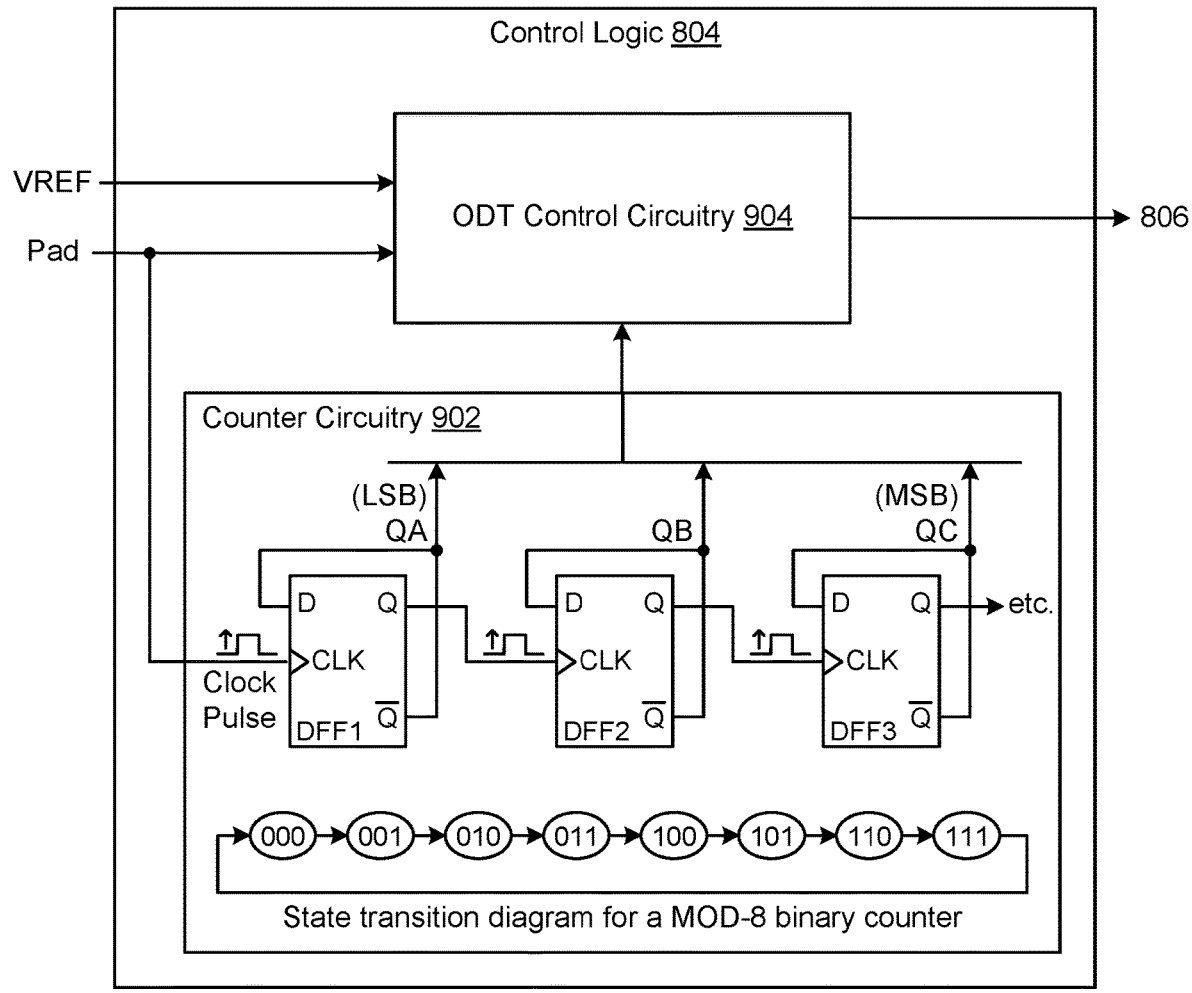
FIG. 9 is a block diagram depicting control logic 804 of the ODT circuitry 802 in accordance with some implementations.

FIG. 9 is a block diagram depicting control logic 804 of the ODT circuitry 802 in accordance with some implementations. Control logic 804 includes country circuitry 902 and ODT control circuitry 904.

The country circuitry 902 may be implemented by a modulo N counter (e.g., a MOD-8 binary counter), where N is the sum of all of the clocks that toggled in each ODT stage. The counter may comprise a plurality of D-type flip flips (DFF1, DFF2, and so forth) implemented in a counter configuration (with non-inverted output Q coupled to the click input of the next flip flop, and the inverted output Q' coupled to the D input of the current flip flop).

The counter circuitry 902 provides counts corresponding to the number of clock pulses to the ODT control circuitry 904, which controls the resistor pair switches of the ODT circuitry 802 via control signal(s) 806. The ODT control circuitry 904 closes all of the switches for the first ODT stage (corresponding to the beginning of a read operation), and successively opens the switches during subsequent ODT stages as described above. The ODT control circuitry 904 opens the various switches for each ODT stage when the clock reaches the reference voltage VREF.

Figure 10:
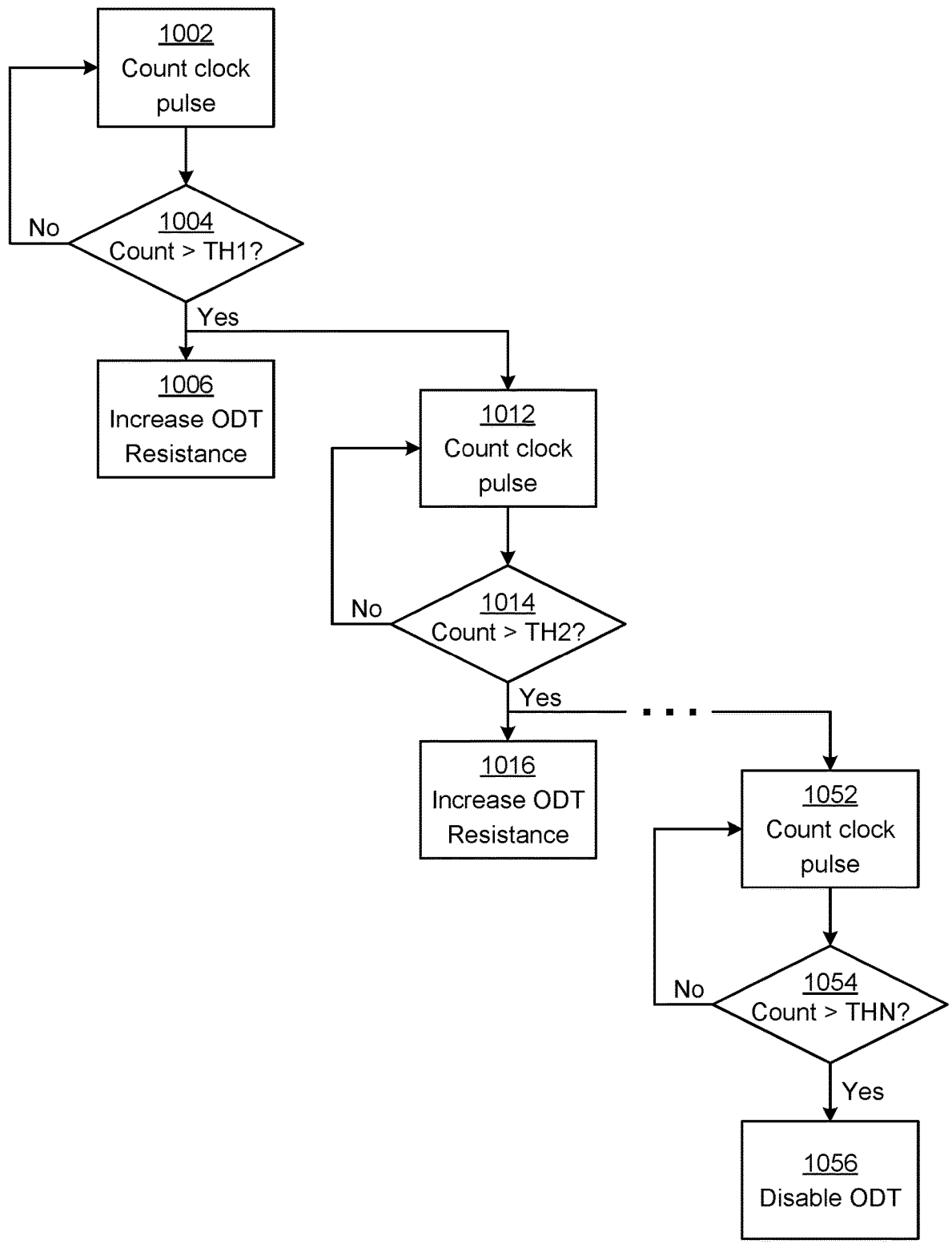
FIG. 10 is an ODT control method 1000 for execution by the control logic 804 in accordance with some implementations.

FIG. 10 is an ODT control method 1000 for execution by the control logic 804 in accordance with some implementations. Before method 1000 begins, all of the ODT switches are closed, minimizing the resistance of the ODT circuitry 802. Method 1000 begins upon receiving clock pulses on the RE/BRE signal lines in response to a read command initiated by the storage controller 102.

The counter 902 counts (1002) the pulses, and the control circuitry 904 determines (1004) whether each count reaches a first threshold TH1. The first threshold corresponds to one or more pulses that characterize the first ODT stage. The first ODT stage corresponds to the time period in which the impedance mismatch described above has its greatest effect on pulse reflections. FIG. 8B depicts an example TH1 of two pulses from the beginning of the read operation. The window of time between the beginning of a read operation and TH1 (e.g., including two pulses) may be referred to as a first stage of the read operation, the first stage being defined by the number of pulses between the beginning of the read operation and TH1.

When the pulse count reaches the first threshold TH1, the ODT control circuitry 904 increases (1006) ODT resistance of the ODT circuitry 802 by opening a first pair of switches, thereby disconnecting a first pair of resistors from the signal path (e.g., disconnecting R1 and R2), which causes the ODT circuitry 802 to enter the second stage.

During the second stage, the counter 902 continues to count (1012) the pulses, and the control circuitry 904 determines (1014) whether each count reaches a second threshold TH2. The second threshold may be with respect to the first threshold TH1, or with respect to the beginning of the read operation. For example, FIG. 8B depicts the second threshold TH2 has being two clock pulses after the first threshold TH1, or four clock pulses after the beginning of the read operation. The window of time between TH1 and TH2 may be referred to as a second stage of the read operation, the second stage being defined by the number of pulses between TH1 and TH2 (e.g., two pulses)

When the pulse count reaches the second threshold TH2, the ODT control circuitry 904 increases (1016) ODT resistance of the ODT circuitry 802 by opening a second pair of switches, thereby disconnecting a second pair of resistors from the signal path (e.g., disconnecting R3 and R4), which causes the ODT circuitry 802 to enter the third stage.

The method continues with successive pulse counting, threshold determinations, and ODT resistance increases as described above until the final stage. Once the counter 902 counts (1052) a pulse that the control circuitry 904 determines (1054) to be the final threshold THN (e.g., TH6 in FIG. 8B), the control circuitry 904 disables (1056) ODT by opening the last pair of switches, thereby disconnecting the final pair of resistors from the signal path (e.g., disconnecting R11 and R12), which causes ODT to be disabled.

The remaining clock cycles for RE/BRE signals associated with the read operation are received at the I/O interface 330 in an unterminated configuration (since ODT is disabled). The window of time during which ODT is disabled may be referred to as a final stage of the read operation, the final stage being defined by the amount of time (or the number of pulses) it takes to finish the read operations after reaching THN (e.g., after reaching TH6).

Method 1000 and associated ODT circuitry 802 and 804 provide data storage systems that can operate reliably with (i) high toggling frequencies (e.g., such as 800 MB/sec or higher, as specified by the TM1600 specification or future specifications), and (ii) multiple (up to 16 or more) stacked dies (e.g., high capacity and high frequency storages). The dynamic ODT adjusting operations (also referred to as dynamic impedance matching or tuning operations) described above with reference to FIGS. 8A-10 absorb signal reflections during the transient state for harmonic clock signals (e.g., RE/BRE, DQS/BDQS, and so forth) without reducing performance (as discussed with reference to FIG. 6) and without adding significant DC power consumption (as discussed with reference to FIG. 7). As such, data may be reliably conveyed across the interface channel 114 in high capacity and high frequency storage systems without sacrificing performance or power consumption.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims.

For example, specific features of the exemplary embodiments may or may not be part of the claimed invention, different components as opposed to those specifically mentioned may perform at least some of the features described herein, and features of the disclosed embodiments may be combined.

As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another.

For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims.

As used in the description of the implementations and the appended claims, the singular forms "a", "an" and "the" are intended to include the plural forms as well, unless the context clearly indicates otherwise.

It will also be understood that the term "and/or" as used herein refers to and encompasses any and all possible combinations of one or more of the associated listed items.

It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context.

Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system comprising:
   a package including a plurality of memory dies and interface circuitry;
   wherein the interface circuitry includes:
      a receiver coupled to the plurality of memory dies and configured to receive pulses of a read clock signal associated with a read operation;
      an input/output (I/O) contact pad coupled to the receiver via a signal path and configured for coupling to a corresponding pad of a storage controller via an interface channel; and
      on-die-termination (ODT) circuitry coupled to the I/O contact pad and the receiver;
   wherein the ODT circuitry includes:

a plurality of resistor pairs, wherein each resistor pair of the plurality of resistor pairs includes (i) a pull-up resistor selectively coupled to the signal path via a first switch, and (ii) a pull-down resistor selectively coupled to the signal path via a second switch; and ODT control circuitry configured to (i) enable ODT at the interface circuitry by causing each of the first and second switches of each resistor pair to be closed during a first stage of the read operation, and (ii) disable ODT at the interface circuitry by causing each of the first and second switches of each resistor pair to be open during a final stage of the read operation.

2. The data storage system of claim 1, wherein:
the first stage is defined by a first predetermined number of pulses of the read clock signal associated with the read operation; and
the final stage is defined by a final predetermined number of pulses of the read clock signal associated with the read operation.

3. The data storage system of claim 2, wherein the ODT control circuitry is further configured to successively decrease ODT at the interface circuitry by:
causing first and second switches associated with a first resistor pair of the plurality of resistor pairs to be open during a second stage of the read operation, the second stage following the first stage and defined by a second predetermined number of pulses;
causing first and second switches associated with the first resistor pair and a second resistor pair of the plurality of resistor pairs to be open during a third stage of the read operation, the third stage following the second stage and defined by a third predetermined number of pulses; and
causing first and second switches associated with the first resistor pair, the second resistor pair, and a third resistor pair of the plurality of resistor pairs to be open during a fourth stage of the read operation, the fourth stage following the third stage and defined by a fourth predetermined number of pulses.

4. The data storage system of claim 1, wherein a minimum pulse width of the read clock signal remains, during the first stage and the final stage, above a predetermined threshold associated with the receiver.

5. The data storage system of claim 1, wherein:
the plurality of resistor pairs includes six resistor pairs; and
the final stage is at least a seventh stage of the read operation.

6. The data storage system of claim 1, wherein:
the first stage is associated with at least two pulses and no greater than eight pulses; and
the final stage is associated with at least sixteen pulses.

7. The data storage system of claim 1, wherein each resistor of each resistor pair has an equivalent resistance value.

8. A method of operating a data storage system, the method comprising:
at a package including a plurality of memory dies, interface circuitry, a receiver coupled to the plurality of memory dies, an input/output (I/O) contact pad coupled to the receiver via a signal path and configured for coupling to a corresponding pad of a storage controller via an interface channel, and on-die-termination (ODT) circuitry coupled to the I/O contact pad and the receiver:

receiving, at the receiver, pulses of a read clock signal associated with a read operation;
prior to receiving the pulses at the receiver, coupling a plurality of resistor pairs to the signal path, wherein each resistor pair of the plurality of resistor pairs includes (i) a pull-up resistor selectively coupled to the signal path via a first switch, and (ii) a pull-down resistor selectively coupled to the signal path via a second switch; and
subsequent to receiving the pulses at the receiver, (i) enabling ODT at the interface circuitry by causing each of the first and second switches of each resistor pair to be closed during a first stage of the read operation, and (ii) disabling ODT at the interface circuitry by causing each of the first and second switches of each resistor pair to be open during a final stage of the read operation.

9. The method of claim 8, wherein:
the first stage is defined by a first predetermined number of pulses of the read clock signal associated with the read operation; and
the final stage is defined by a final predetermined number of pulses of the read clock signal associated with the read operation.

10. The method of claim 9, further comprising successively decreasing ODT at the interface circuitry by:
causing first and second switches associated with a first resistor pair of the plurality of resistor pairs to be open during a second stage of the read operation, the second stage following the first stage and defined by a second predetermined number of pulses;
causing first and second switches associated with the first resistor pair and a second resistor pair of the plurality of resistor pairs to be open during a third stage of the read operation, the third stage following the second stage and defined by a third predetermined number of pulses; and
causing first and second switches associated with the first resistor pair, the second resistor pair, and a third resistor pair of the plurality of resistor pairs to be open during a fourth stage of the read operation, the fourth stage following the third stage and defined by a fourth predetermined number of pulses.

11. The method of claim 8, wherein a minimum pulse width of the read clock signal remains, during the first stage and the final stage, above a predetermined threshold associated with the receiver.

12. The method of claim 8, wherein:
the plurality of resistor pairs includes six resistor pairs; and
the final stage is at least a seventh stage of the read operation.

13. The method of claim 8, wherein:
the first stage is associated with at least two pulses and no greater than eight pulses; and
the final stage is associated with at least sixteen pulses.

14. The method of claim 8, wherein each resistor of each resistor pair has an equivalent resistance value.

15. A data storage system comprising:
at a package including a plurality of memory dies, interface circuitry, a receiver coupled to the plurality of memory dies, an input/output (I/O) contact pad coupled to the receiver via a signal path and configured for coupling to a corresponding pad of a storage controller via an interface channel, and on-die-termination (ODT) circuitry coupled to the I/O contact pad and the receiver:

means for receiving, at the receiver, pulses of a read clock signal associated with a read operation;

means for, prior to receiving the pulses at the receiver, coupling a plurality of resistor pairs to the signal path, wherein each resistor pair of the plurality of resistor pairs includes (i) a pull-up resistor selectively coupled to the signal path via a first switch, and (ii) a pull-down resistor selectively coupled to the signal path via a second switch; and means for, subsequent to receiving the pulses at the receiver, (i) enabling ODT at the interface circuitry by causing each of the first and second switches of each resistor pair to be closed during a first stage of the read operation, and (ii) disabling ODT at the interface circuitry by causing each of the first and second switches of each resistor pair to be open during a final stage of the read operation.

16. The data storage system of claim 15, wherein:
the first stage is defined by a first predetermined number of pulses of the read clock signal associated with the read operation; and
the final stage is defined by a final predetermined number of pulses of the read clock signal associated with the read operation.

17. The data storage system of claim 16, further comprising means for successively decreasing ODT at the interface circuitry, including:
means for causing first and second switches associated with a first resistor pair of the plurality of resistor pairs to be open during a second stage of the read operation, the second stage following the first stage and defined by a second predetermined number of pulses;
means for causing first and second switches associated with the first resistor pair and a second resistor pair of the plurality of resistor pairs to be open during a third stage of the read operation, the third stage following the second stage and defined by a third predetermined number of pulses; and
means for causing first and second switches associated with the first resistor pair, the second resistor pair, and a third resistor pair of the plurality of resistor pairs to be open during a fourth stage of the read operation, the fourth stage following the third stage and defined by a fourth predetermined number of pulses.

18. The data storage system of claim 15, wherein a minimum pulse width of the read clock signal remains, during the first stage and the final stage, above a predetermined threshold associated with the receiver.

19. The data storage system of claim 15, wherein:
the plurality of resistor pairs includes six resistor pairs;
the final stage is at least a seventh stage of the read operation; and
each resistor of each resistor pair has an equivalent resistance value.

20. The data storage system of claim 15, wherein:
the first stage is associated with at least two pulses and no greater than eight pulses; and
the final stage is associated with at least sixteen pulses.

* * * * *